US009646556B2

(12) United States Patent
Lee et al.

(10) Patent No.: US 9,646,556 B2
(45) Date of Patent: May 9, 2017

(54) DISPLAY APPARATUS AND METHOD OF MANUFACTURING THE SAME

(71) Applicant: Samsung Display Co., Ltd., Yongin (KR)

(72) Inventors: Sooyeon Lee, Seoul (KR); Seung-Hwan Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 138 days.

(21) Appl. No.: 14/744,824

(22) Filed: Jun. 19, 2015

(65) Prior Publication Data
US 2016/0189650 A1    Jun. 30, 2016

(30) Foreign Application Priority Data

Dec. 26, 2014    (KR) .................. 10-2014-0190588

(51) Int. Cl.
  *G06F 3/038*    (2013.01)
  *G09G 3/36*    (2006.01)
  *H01L 27/12*    (2006.01)

(52) U.S. Cl.
  CPC ......... *G09G 3/3648* (2013.01); *H01L 27/124* (2013.01); *H01L 27/1259* (2013.01); *G09G 3/3607* (2013.01); *G09G 3/3614* (2013.01); *G09G 2300/0426* (2013.01)

(58) Field of Classification Search
  None
  See application file for complete search history.

(56) References Cited

U.S. PATENT DOCUMENTS

| 2015/0340001 | A1 | 11/2015 | Jung et al. |
| 2016/0005351 | A1* | 1/2016 | Jeon ............ G09G 3/20 345/204 |
| 2016/0118410 | A1* | 4/2016 | Chong .......... H01L 27/1248 257/401 |

FOREIGN PATENT DOCUMENTS

| KR | 10-2005-0015163 | 2/2005 |
| KR | 10-2011-0042674 | 4/2011 |
| KR | 10-2016-0049615 | 5/2016 |

\* cited by examiner

*Primary Examiner* — Joseph Haley
*Assistant Examiner* — Ifedayo Iluyomade
(74) *Attorney, Agent, or Firm* — H.C. Park & Associates, PLC

(57) ABSTRACT

A display apparatus includes a display panel on which first and second gate lines extending in a third direction between a first direction and a second direction crossing the first direction, data lines extending in the second direction, connection lines extending in a fourth direction crossing the third direction to be connected to the second gate lines, and pixels including pixel areas are disposed and a black matrix disposed in a non-pixel area surrounding each of the pixel areas. The black matrix includes a first black matrix not overlapped with the connection lines and second black matrices overlapped with the connection lines.

20 Claims, 14 Drawing Sheets

DISPLAY APPARATUS AND METHOD OF MANUFACTURING THE SAME

CROSS REFERENCE TO RELATED APPLICATION

This application claims priority from and the benefit of Korean Patent Application No. 10-2014-0190588, filed on Dec. 26, 2014, which is hereby incorporated by reference for all purposes as if fully set forth herein.

BACKGROUND

Field

Exemplary embodiments relate to a display apparatus and a method of manufacturing the display apparatus.

Discussion of the Background

In general, a display apparatus includes a display panel having pixels in order to display an image on the display panel, a gate driver applying gate signals to the pixels, and a data driver applying data voltages to the pixels. The pixels receive the data voltages in response to the gate signals to display the image.

The display panel typically includes a display area in which the pixels are disposed and a non-display area surrounding the display area. The non-display area is also referred to as a bezel area. The gate driver may be disposed in the non-display area adjacent to a left side of the display area and the data driver may be connected the non-display area adjacent to an upper side of the display area. Accordingly, it is difficult to realize a narrow bezel since a separate area for the gate driver is needed.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display apparatus capable of realizing a narrow bezel and improving a transmission characteristic of a gate signal.

Exemplary embodiments also provide a method of manufacturing the display apparatus, which is capable of reducing a manufacturing cost and simplifying a manufacturing process.

Additional features of the invention will be set forth in the description which follows, and in part will be apparent from the description, or may be learned by practice of the invention.

An exemplary embodiment discloses a display apparatus including a display panel and a black matrix. The display panel includes a plurality of first gate lines and a plurality of second gate lines extending in a third direction between a first direction and a second direction crossing the first direction, data lines extending in the second direction, connection lines extending in a fourth direction crossing the third direction and connected to the second gate lines, and a plurality of pixels including pixel areas, connected to the first gate lines, the connection lines, and the data lines, and disposed on the display panel. The black matrix is disposed in a non-pixel area surrounding each of the pixel areas. The black matrix includes a first black matrix not overlapped with the connection lines and a plurality of second black matrices overlapped with the connection lines.

An exemplary embodiment also discloses manufacturing method of the display apparatus, including forming a plurality of first gate lines and a plurality of second gate lines extending in a third direction between a first direction and a second direction crossing the first direction, forming data lines insulated from the first and second gate lines and extending in the second direction, forming connection lines insulated from the data lines, extending in a fourth direction crossing the third direction, and connected to the second gate lines, forming a plurality of pixels including pixel areas, the pixels being connected to the first gate lines, the connection lines, and the data lines, and forming a black matrix on the pixels in a non-pixel area surrounding each of the pixel areas. The black matrix includes a first black matrix not overlapped with the connection lines and a plurality of second black matrices overlapped with the connection lines.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
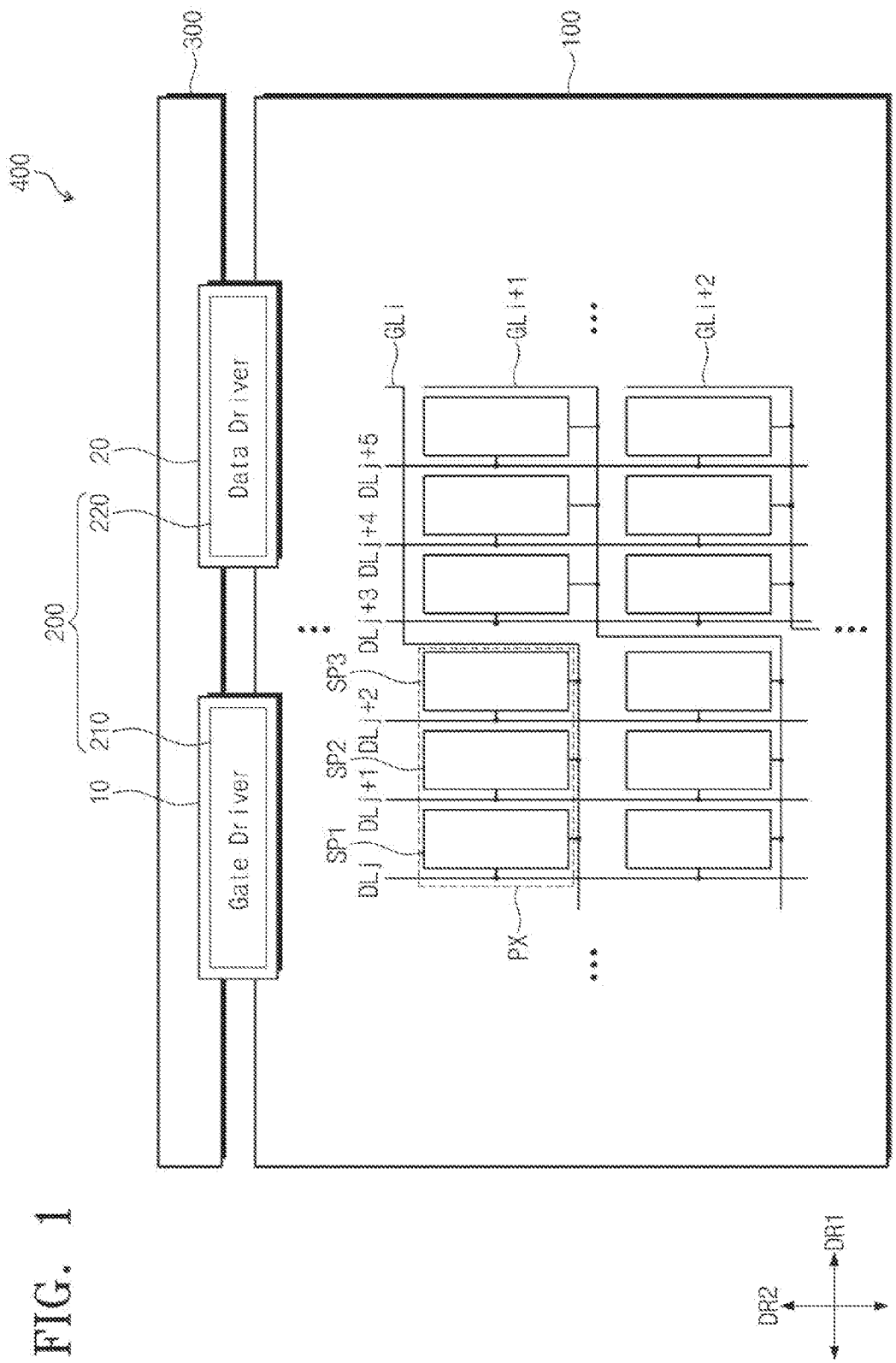
FIG. 1 is a plan view showing a display apparatus according to an exemplary embodiment.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to"

another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

FIG. 1 is a plan view showing a display apparatus 400 according to an exemplary embodiment.

Referring to FIG. 1, the display apparatus 400 includes a display panel 100 for displaying an image, a driver 200 driving the display panel 100, and a printed circuit board 300 controlling the driver 200.

In the present exemplary embodiment, the display panel 100 may be, but not limited to, a liquid crystal display panel including a liquid crystal layer. For instance, the display panel 100 may include a first substrate, a second substrate facing the first substrate, and a liquid crystal layer interposed between the first and second substrates (described in more detail later).

However, the display panel 100 is not limited to a liquid crystal display panel. For example, the display panel 100 may be an electrophoretic display panel including an electrophoretic layer, an electrowetting display panel including an electrowetting layer, or an organic light emitting display panel including an organic light emitting layer.

The display panel 100 has long sides in a first direction DR1 and short sides in a second direction DR2 crossing the first direction DR1. The first direction DR1 corresponds to a row direction, and the second direction DR2 corresponds to a column direction.

The display panel 100 includes a plurality of gate lines GLi to GLi+2, a plurality of data lines DLj to DLj+5, a plurality of connection lines (not shown), and a plurality of pixels PX. Here, "i" and "j" are natural numbers.

FIG. 1 shows three gate lines GLi to GLi+2 and six data lines DLj to DLj+5, however, the number of the gate lines and the number of the data lines, which are substantially disposed on the display panel 100, may be more than the number of the gate lines and the number of the data lines shown in FIG. 1. Details on the arrangement of the gate lines GLi to GLi+2, the data lines DLj to DLj+5, and the connection lines will be described with reference to FIGS. 2 to 4.

The gate lines GLi to GLi+2 extend substantially in a diagonal direction. The diagonal direction corresponds to a direction between the first direction DR1 and the second direction DR2 on a plane surface defined by the first direction DR1 and the second direction DR2. In addition, the gate lines GLi to GLi+2 may extend substantially in the diagonal direction with a stepped shape.

The data lines DLj to DLj+5 extend substantially in the second direction DR2. The gate lines GLi to GLi+2 and the data lines DLj to DLj+5 are disposed on the first substrate. The gate lines GLi to GLi+2 and the data lines DLj to DLj+5 are disposed to be insulated from each other while crossing each other.

The pixels PX are arranged in a matrix configuration and connected to the gate lines GLi to GLi+2 and the data lines DLj to DLj+5. Each pixel PX includes a first sub-pixel SP1, a second sub-pixel SP2, and a third sub-pixel SP3. The first, second, and third sub-pixels SP1, SP2, and SP3 are arranged in the first direction DR1. Each of the first, second, and third sub-pixels SP1, SP2, and SP3 has a substantially rectangular shape.

Each of the first, second, and third sub-pixels SP1, SP2, and SP3 of the pixels PX is connected to a corresponding gate line of the gate lines GLi to GLi+2 and a corresponding data line of the data lines DLj to DLj+5.

Each of the first, second, and third sub-pixels SP1, SP2, and SP3 displays one of the primary colors. The primary colors may include a red color, a green color, and a blue color, but, they should not be limited thereto or thereby. That is, the primary colors may include various colors, such as a white color, a yellow color, a cyan color, and/or a magenta color. Hereinafter, however, the primary colors are assumed to include the red, green, and blue colors.

The driver 200 includes a gate driver 210 and a data driver 220. The gate lines GLi to GLi+2 may extend to be connected to the gate driver 210. The data lines DLj to DLj+5 may extend to be connected to the data driver 220.

The gate driver 210 is mounted on a first flexible circuit board 10, and the data driver 220 is mounted on a second flexible circuit board 20. The first and second flexible circuit boards 10 and 20 are connected between one side (hereinafter, referred to as an upper side) of the display panel 100 and the printed circuit board 300 in the second direction DR2.

In exemplary embodiments, the gate driver 210 and the data driver 220 are connected to the display panel 100 and the printed circuit board 300 in a tape carrier package (TCP) manner, but they should not be limited thereto or thereby. For example, the gate driver 210 and the data driver 220 may be formed in a plurality of driving chips and mounted on the display panel 100 in a chip-on-glass (COG) manner.

As shown in FIG. 1, the gate driver 210 is disposed adjacent to a left side of the upper side of the display panel 100, and the data driver 220 is disposed adjacent to a right side of the upper side of the display panel 100, but they should not be limited thereto or thereby. That is, the positions of the gate driver 210 and the data driver 220 may be interchanged or set in various other ways.

The gate driver 210 is not directly integrated on the display panel 100, and the gate driver 210 and the data driver 220 is connected to the upper side of the display panel 100. That is, portions of the gate driver 210 and the data driver 220 are connected to the same one side of the display panel 100 such that the gate driver 210 is not fully placed on the display panel 100. Thus, a narrow bezel may be realized at three sides of the display panel 100, at which the driver 200 is not disposed, except for the upper side to which the driver 200 is connected.

The gate driver 210 may receive a gate control signal from a timing controller (not shown) mounted on the printed circuit board 300. Although not shown in figures, the timing controller may be mounted on the printed circuit board 300 as an integrated circuit chip and connected to the gate driver 210 and the data driver 220.

The gate driver 210 may generate a plurality of gate signals in response to the gate control signal. The gate signals may be applied to the pixels PX through the gate lines GLi to GLi+2.

The data driver 220 may receive image signals and a data control signal from the timing controller. The data driver 220 may generate data voltages in analog form corresponding to the image signals in response to the data control signal. The data voltages may be applied to the pixels PX through the data lines DLj to DLj+5.

The pixels PX may receive the data voltages through the data lines DLj to DLj+5 in response to the gate signals provided through the gate lines GLi to GLi+2. The pixels PX may display grayscales corresponding to the data voltages. Thus, an image may be displayed.

Figure 2:
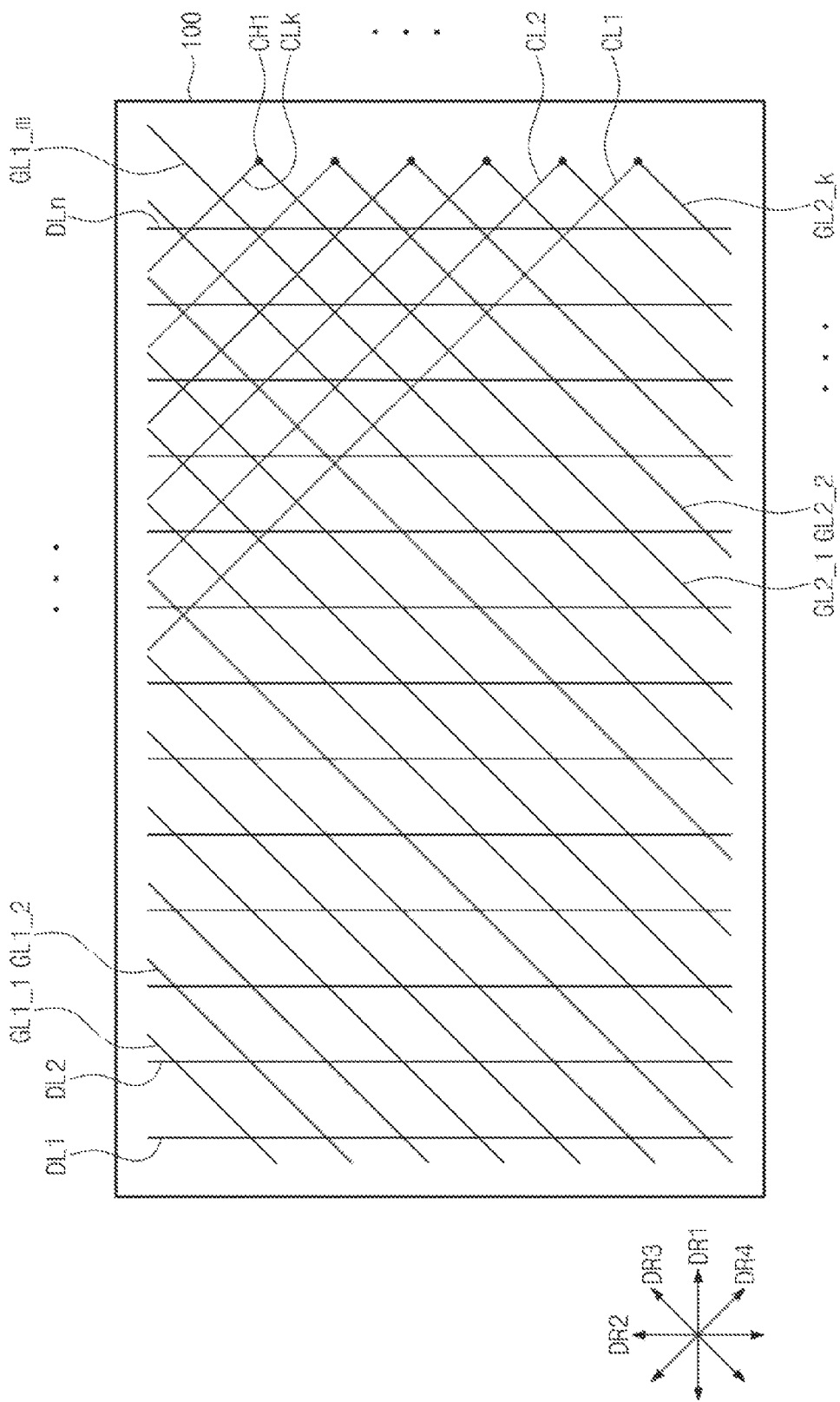
FIG. 2 is a view showing gate lines, data lines, and connection lines disposed on the display panel shown in FIG. 1.

FIG. 2 is a diagram showing the gate lines, the data lines, and connection lines disposed on the display panel shown in FIG. 1.

Referring to FIG. 2, the display panel 100 includes a plurality of gate lines GL1_1 to GL1_$m$ and GL2_1 to GL2_$k$, a plurality of data lines DL1 to DLn, and a plurality of connection lines CL1 to CLk.

The gate lines GL1_1 to GL1_$m$ and GL2_1 to GL2_$k$ extend in a third direction DR3, which corresponds to the diagonal direction between the first direction DR1 and the second direction DR2. The gate lines GL1_1 to GL1_$m$ and GL2_1 to GL2_$k$ are arranged in a fourth direction DR4 crossing the third direction DR3. The connection lines CL1 to CLk extend in the fourth direction DR4 and are arranged in the third direction DR3.

The gate lines GL1_1 to GL1_$m$ and GL2_1 to GL2_$k$ and the connection lines CL1 to CLk extend in the substantially diagonal direction and have a stepped shape. Details on the gate lines GL1_1 to GL1_$m$ and GL2_1 to GL2_$k$ and the connection lines CL1 to CLk extending in the substantially diagonal direction and having the stepped shape will be described with reference to FIGS. 3 and 4.

The third direction DR3 and the fourth direction DR4 are obtained when the first direction DR1 is rotated in each of a counter-clockwise direction and a clockwise direction by the same degree. For instance, the third direction DR3 is a direction obtained when the first direction DR1 is rotated in the counter-clockwise direction by about 45 degrees. The fourth direction DR4 is obtained when the first direction DR1 is rotated in the clockwise direction by about 45 degrees.

The gate lines GL1_1 to GL1_$m$ and GL2_1 to GL2_$k$ include a plurality of first gate lines GL1_1 to GL1_$m$ and a plurality of second gate lines GL2_1 to GL2_$k$.

First ends of each of the the first gate lines GL1_1 to GL1_$m$ are disposed on the upper side of the display panel 100. The first ends of the first gate lines GL1_1 to GL1_$m$ are connected to the gate driver 210 to receive the gate signals.

First ends of the second gate lines GL2_1 to GL2_$k$ are disposed at one side (hereinafter, referred to as a right side) of the display panel 100 in the first direction DR1.

Since the gate driver 210 is disposed at the upper side of the display panel 100, the second gate lines GL2_1 to GL2_$k$ are not directly connected to the gate driver 210. The connection lines CL1 to CLk are disposed on the display panel 100 to connect the second gate lines GL2_1 to GL2_$k$ to the gate driver 210.

In detail, first ends of the connection lines CL1 to CLk are disposed at the upper side of the display panel 100. The first ends of the connection lines CL1 to CLk are connected to the gate driver 210 disposed at the upper side of the display panel 100 and receive the gate signals.

Second ends of each connection lines CL1 to CLk are connected to a first end of a corresponding second gate line of the second gate lines GL2_1 to GL2_$k$. First to $k$-th connection lines CL1 to CLk, which are sequentially disposed from the right side to the left side, are reversely connected to the (second-first) to (second-$k$)th gate lines GL2_1 to GL2_$k$, which are sequentially disposed from the upper side to a lower side, in a one-to-one correspondence.

The connection lines CL1 to CLk are connected to the second gate lines GL2_1 to GL2_k through first contact holes CH1. Details on this will be described later. Thus, the connection lines CL1 to CLk may receive the gate signals and may provide the gate signals to the second gate lines GL2_1 to GL2_k.

The data lines DL1 to DLn extend in the second direction DR2 and are arranged in the first direction DR1.

Figure 3:
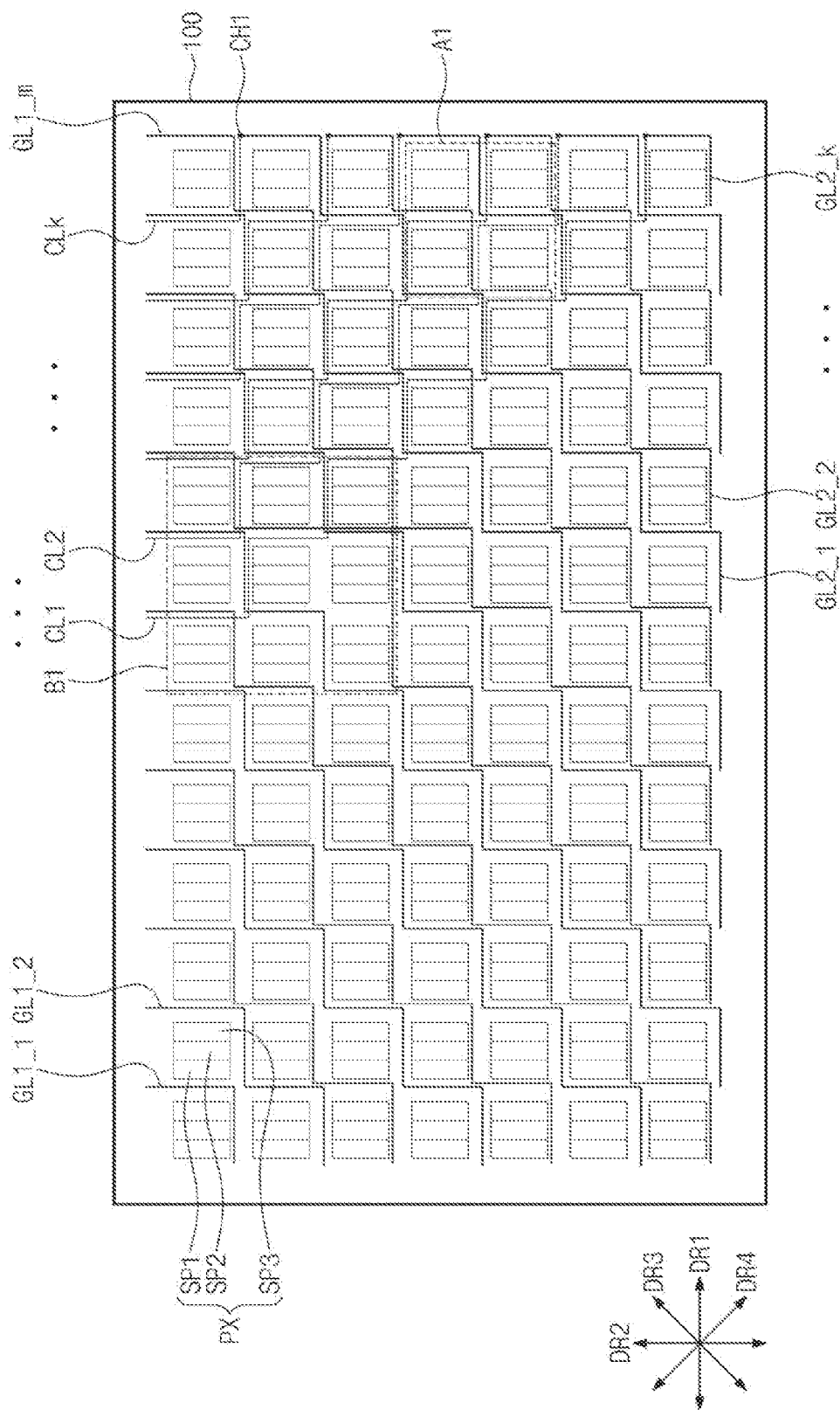
FIG. 3 is a plan view showing pixels, the gate lines, and the connection lines of the display panel shown in FIG. 1.

FIG. 3 is a plan view showing the pixels, the gate lines, and the connections lines of the display panel shown in FIG. 1.

For the convenience of explanation, FIG. 3 shows the first and second gate lines GL1_1 to GL1_m and GL2_1 to GL2_k and the connection lines CL1 to CLk extending having a stepped shape, and the data lines DL1 to DLn are omitted.

Referring to FIG. 3, the first and second gate lines GL1_1 to GL1_m and GL2_1 to GL2_k substantially extend in the third direction DR3 while being repeatedly bent to correspond to the stepped shape. The connection lines CL1 to CLk substantially extend in the fourth direction DR4 while being repeatedly bent to correspond to the stepped shape.

In a comparative example, the first and second gate lines GL1_1 to GL1_m and GL2_1 to GL2_k extend in a straight line shape along the third direction DR3 and the connection lines CL1 to CLk extend in a straight line shape along the fourth direction DR4, the first and second gate lines GL1_1 to GL1_m and GL2_1 to GL2_k and the connection lines CL1 to CLk overlap the pixels PX. In this case, a light transmittance (or an aperture rate) may be deteriorated due to the first and second gate lines GL1_1 to GL1_m and GL2_1 to GL2_k and the connection lines CL1 to CLk including a metal material.

Hereinafter, areas in which pixel electrodes PE are disposed are referred to as pixel areas, and areas between the pixel electrodes PE is referred to as non-pixel areas. Areas between an edge of the display panel 100 and the pixel electrodes PE are included in the non-pixel area. That is, areas on a plane surface of the pixels PX include the pixel areas and the non-pixel area surrounding each pixel area. The pixel areas have a substantially rectangular shape corresponding to the shape of the pixel electrodes PE.

In order to prevent the deterioration of the light transmittance that may occur in the comparative example described above, the first and second gate lines GL1_1 to GL1_m and GL2_1 to GL2_k and the connection lines CL1 to CLk extend via the non-pixel area.

The first and second gate lines GL1_1 to GL1_m and GL2_1 to GL2_k substantially extend in the third direction DR3 having the stepped shape in the non-pixel area between the pixels PX. The connection lines CL1 to CLk substantially extend in the fourth direction DR4 having the stepped shape in the non-pixel area between the pixels PX.

Each of the pixels PX includes the first, second, and third sub-pixels SP1, SP2, and SP3. Therefore, the first and second gate lines GL1_1 to GL1_m and GL2_1 to GL2_k and the connection lines CL1 to CLk are bent every one pixel PX in the second direction DR2, and the first and second gate lines GL1_1 to GL1_m and GL2_1 to GL2_k and the connection lines CL1 to CLk are bent every three sub-pixels (SP1, SP2, and SP3) in the first direction DR1.

Figure 4:
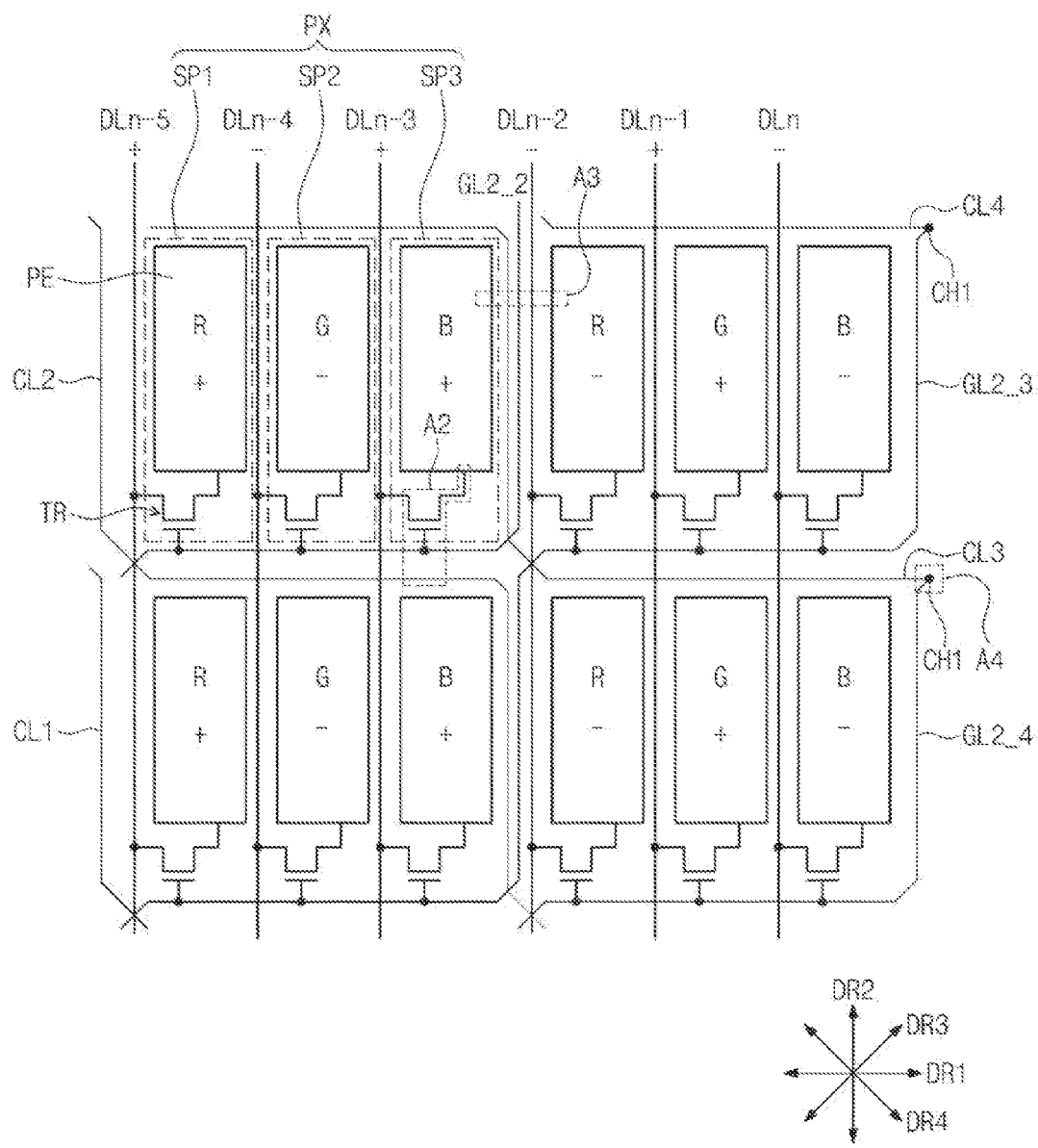
FIG. 4 is an enlarged view showing a portion of A1 shown in FIG. 3.

FIG. 4 is an enlarged view showing a portion of A1 shown in FIG. 3.

For the convenience of explanation, FIG. 4 shows only four pixels PX, however, the other pixels have a similar structure as that of the pixels PX shown in FIG. 4.

Referring to FIG. 4, the first sub-pixel SP1 is a red pixel R, which may display the red color. The second sub-pixel SP2 is a green pixel G, which may display the green color. The third sub-pixel SP3 is a blue pixel B, which may display the blue color.

Thus, the sub-pixels having the same color are arranged in the same column. In addition, the sub-pixels are arranged in order of the red pixel R, the green pixel G, and the blue pixel B in the row direction, but they should not be limited thereto or thereby. That is, the arrangement of the first, second, and third sub-pixels SP1, SP2, and SP3 may be changed in various ways.

Each of the first, second, and third sub-pixels SP1, SP2, and SP3 includes a transistor TR connected to a corresponding gate line of the second gate lines GL2_2 to GL2_4 and a corresponding data line of the data lines DLn−5 to DLn and a pixel electrode PE connected to the transistor TR.

The transistor TR includes a gate electrode connected to a corresponding second gate line of the second gate lines GL2_2 to GL2_4, a source electrode connected to a corresponding data line of the data lines DLn−5 to DLn, and a drain electrode connected to the pixel electrode PE.

As described above, the second gate lines GL2_2 to GL2_4 and the connection lines CL1 to CL4 are bent every one pixel PX in the second direction DR2 and are bent every three sub-pixels (SP1, SP2, and SP3) in the first direction DR1.

The second end of the connection line CL3 is connected to the first end of the corresponding second gate line GL2_4 through a first contact hole CH1. The second end of the connection line CL4 is connected to the first end of the corresponding second gate line GL2_3 through the other first contact hole CH1. Thus, the connection lines CL3 and CL4 may receive the gate signals and may provide the gate signals to the second gate lines GL2_4 and GL2_3.

The data lines DLn−5 to DLn are arranged in the first direction DR1 between the sub-pixels SP1, SP2, and SP3 and substantially extend in the second direction DR2. Thus, the data lines DLn−5 to DLn are disposed in the non-pixel area. The data lines DLn−5 to DLn may alternately receive the data voltage having a positive polarity and the data voltage having a negative polarity.

The transistor TR may be turned on in response to the gate signal being provided through the corresponding second gate line. The turned-on transistor TR may apply the data voltage provided through the corresponding data line to the pixel electrode PE.

A common electrode CE (refer to FIGS. 5 to 7) disposed to face the pixel electrode PE may receive a common voltage. An electric field may be formed between the pixel electrode PE and the common electrode by a difference in voltage between the data voltage applied to the pixel electrode PE and the common voltage applied to the common electrode.

Liquid crystal molecules of the liquid crystal layer LC interposed between the pixel electrode PE and the common electrode CE may be driven by the electric field formed between the pixel electrode PE and the common electrode CE. The liquid crystal molecules driven by the electric field control a transmittance of the light passing through the liquid crystal layer to display the image.

Figure 5:
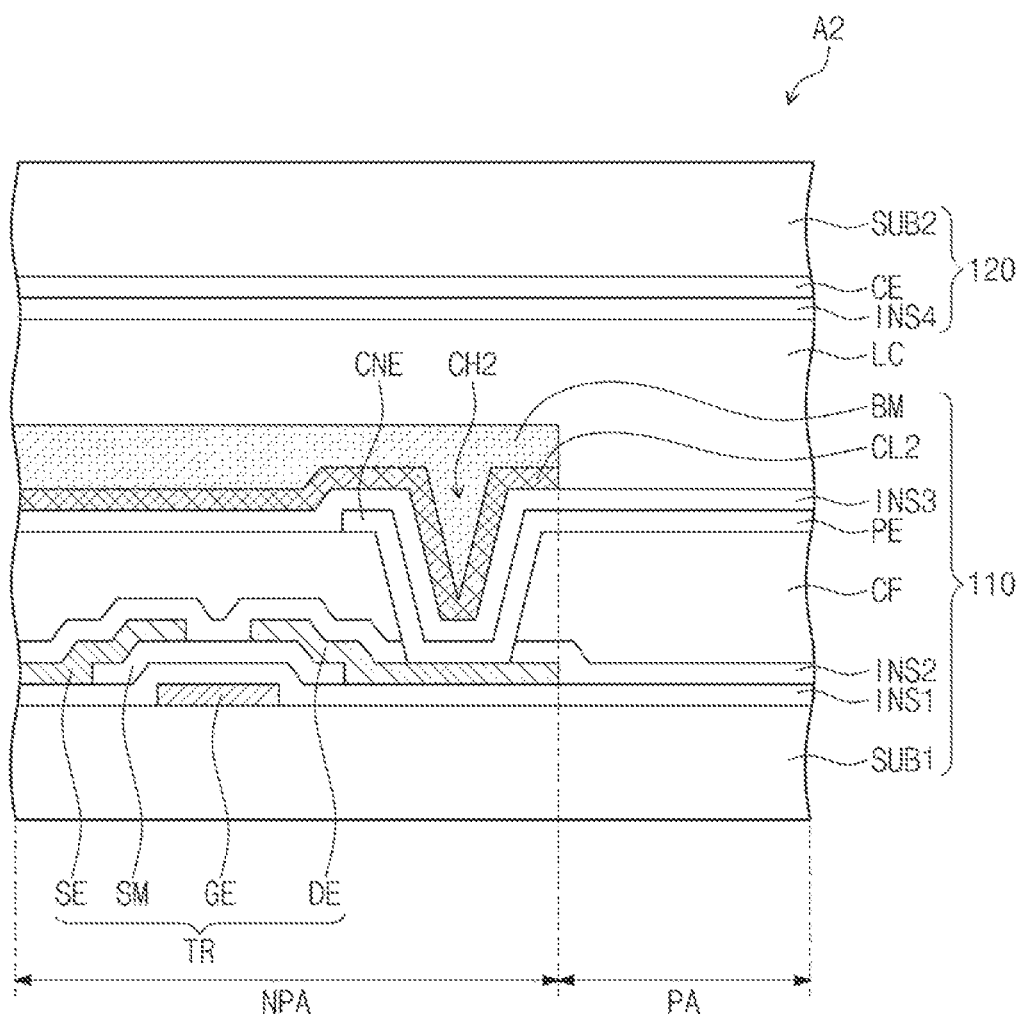
FIG. 5 is a cross-sectional view showing a portion of A2 shown in FIG. 4.
Figure 6:
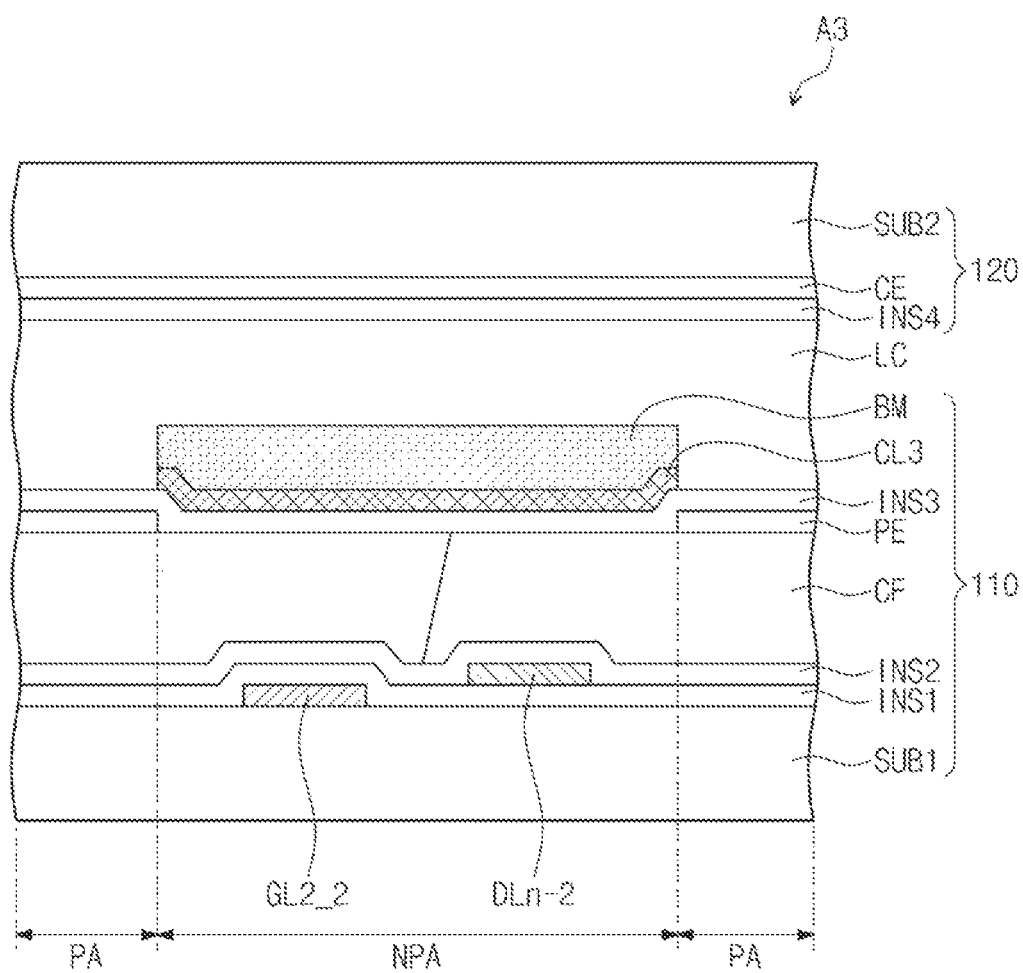
FIG. 6 is a cross-sectional view showing a portion of A3 shown in FIG. 4.
Figure 7:
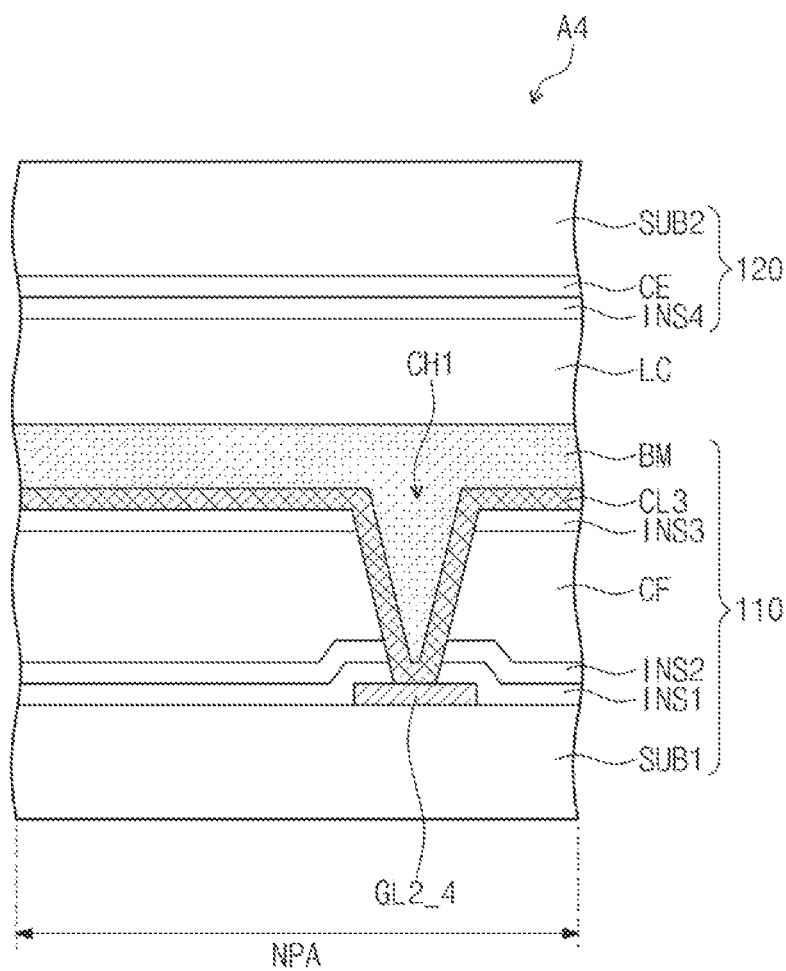
FIG. 7 is a cross-sectional view showing a portion of A4 shown in FIG. 4.

FIG. 5 is a cross-sectional view showing a portion of A2 shown in FIG. 4. FIG. 6 is a cross-sectional view showing a portion of A3 shown in FIG. 4. FIG. 7 is a cross-sectional view showing a portion of A4 shown in FIG. 4.

FIG. 5 is a cross-sectional view showing the cross-sectional structure of the transistor TR and the connection line CL2. FIG. 6 is a cross-sectional view showing the cross-sectional structure of the second gate line GL2_2, the data line DLn−2, and the connection line CL3. FIG. 7 is a cross-sectional view showing the cross-sectional structure of the second gate line GL2_4 and the connection line CL3 connected through the first contact hole CH1.

Referring to FIGS. 5, 6, and 7, the display panel 100 includes the first substrate 110, the second substrate 120, and the liquid crystal layer LC interposed between the first substrate 110 and the second substrate 120.

The first substrate 110 includes a first base substrate SUB1, the transistor TR, a first insulating layer INS1, a second insulating layer INS2, a third insulating layer INS3, a color filer CF, a black matrix BM, the second gate lines GL2_2 and GL2_4, the data line DLn−2, and the connection lines CL2 and CL3.

In detail, the gate electrode GE of the transistor TR and the second gate lines GL2_2 and GL2_4 are disposed on the first base substrate SUB1. Although not shown in figures, the first gate lines GL1_1 to GL1_m are disposed on the first base substrate SUB1.

The first base substrate SUB1 may be a transparent or a non-transparent insulating substrate. For example, the first base substrate SUB1 may be a silicon substrate, a glass substrate, or a plastic substrate.

The first insulating layer INS1 is disposed on the first base substrate SUB1 to cover the gate electrode GE and the second gate lines GL2_2 and GL2_4. The first insulating layer INS1 may serve as a gate insulating layer. The first insulating layer INS1 may be, but is not limited to, an inorganic insulating layer including an inorganic material.

A semiconductor layer SM of the transistor TR is disposed on the first insulating layer INS1 covering the gate electrode GE. Although not shown in figures, the semiconductor layer SM may include an active layer and an ohmic contact layer.

The source electrode SE and the drain electrode DE of the transistor TR are disposed on the semiconductor layer SM and the first insulating layer INS1 and spaced apart from each other. The semiconductor layer SM forms a conductive channel between the source electrode SE and the drain electrode DE. The data line DLn−2 is disposed on the first insulating layer INS1.

The second insulating layer INK is disposed on the first insulating layer INS1 to cover the transistor TR and the data line DLn−2. The second insulting layer INK may serve as a passivation layer. The second insulating layer INK may be, but not limited to, an inorganic layer including an inorganic material. The second insulating layer INK covers an exposed upper portion of the semiconductor layer SM.

The color filters CF are disposed on the second insulating layer INS2. As described above, the sub-pixels having the same color are arranged in the same column. The color filers CF may include a red color filter, a green color filter, and a blue color filter. The color filters CF may assign these colors to the light passing through the first, second, and third sub-pixels SP1, SP2, and SP3, respectively.

The red, green, blue color filters are disposed to correspond to the sub-pixels of a corresponding column. The color filters CF extend in the second direction DR2, and thus the color filters CF are disposed on the sub-pixels having the same color in the second direction DR2. In addition, the color filters CF are arranged in the first direction DR1. As shown in FIG. 6, the color filters CF disposed adjacent to each other may be partially overlapped with each other at a boundary therebetween.

The pixel electrode PE is disposed on the color filters CF in the pixel area PA. The pixel electrode PE may include a transparent conductive material. For instance, the pixel electrode PE may include the transparent conductive material, such as indium tin oxide (ITO), indium zinc oxide (IZO), or indium tin zinc oxide (ITZO).

A connection electrode CNE extending from the pixel electrode PE to the non-pixel area NPA is electrically connected to the drain electrode DE through a second contact hole CH2 that penetrates the color filter CF and the second insulating layer INS2.

The third insulating layer INS3 is disposed on the color filters CF to cover the pixel electrode PE. The connection lines CL2 and CL3 are disposed on the third insulating layer INS3 in the non-pixel area NPA. The black matrix BM is disposed on the connection lines CL2 and CL3 in the non-pixel area NPA. That is, the black matrix BM and the connection lines CL2 and CL3 are disposed to overlap with each other.

The black matrix BM may block light in the non-pixel area NPA. Also, the black matrix BM may prevent light leakage caused by malfunction of the liquid crystal molecules in edge regions of the pixel areas PA.

The second substrate 120 includes a second base substrate SUB2, the common electrode CE disposed under the second base substrate SUB2 and facing the pixel electrode PE, and a fourth insulating layer INS4 disposed under the common electrode CE. The second base substrate SUB2 may be a transparent or a non-transparent insulating substrate.

The common electrode CE may include a transparent conductive material. For instance, the common electrode CE may include the transparent conductive material, such as ITO, IZO, or ITZO.

Figure 8:
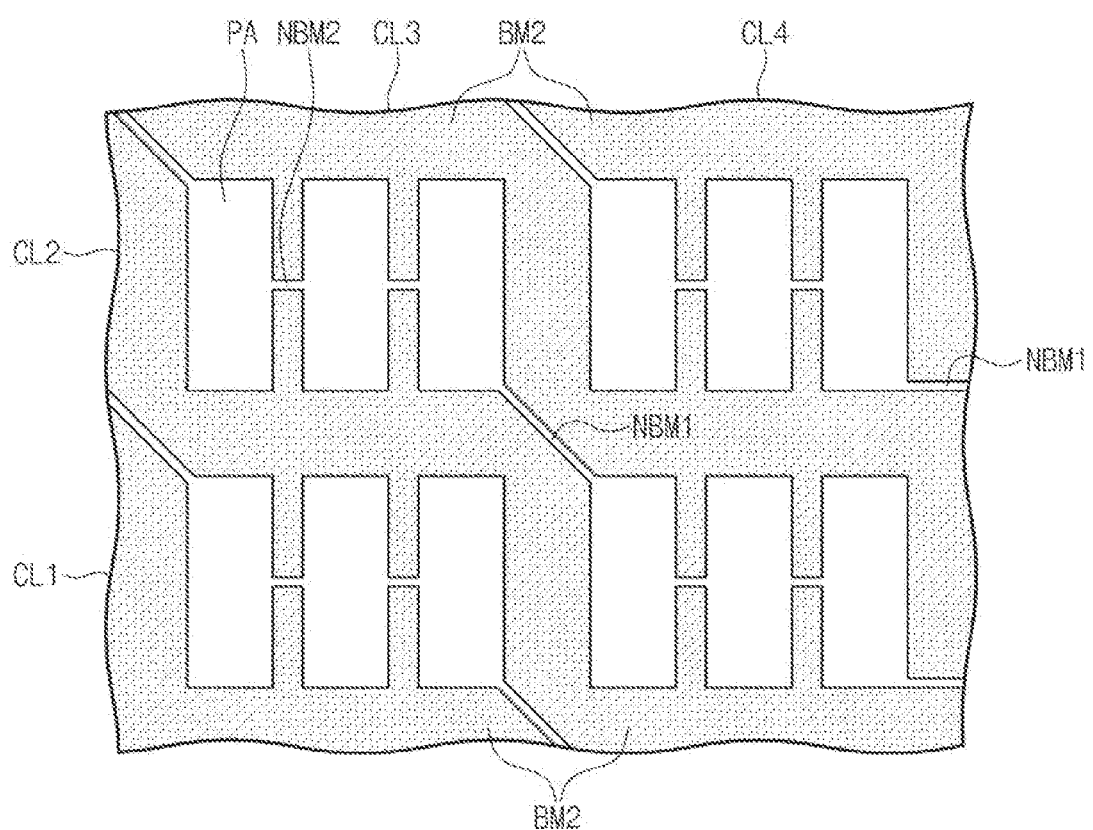
FIG. 8 is an enlarged view showing a black matrix of the portion A1 shown in FIG. 3.
Figure 9:
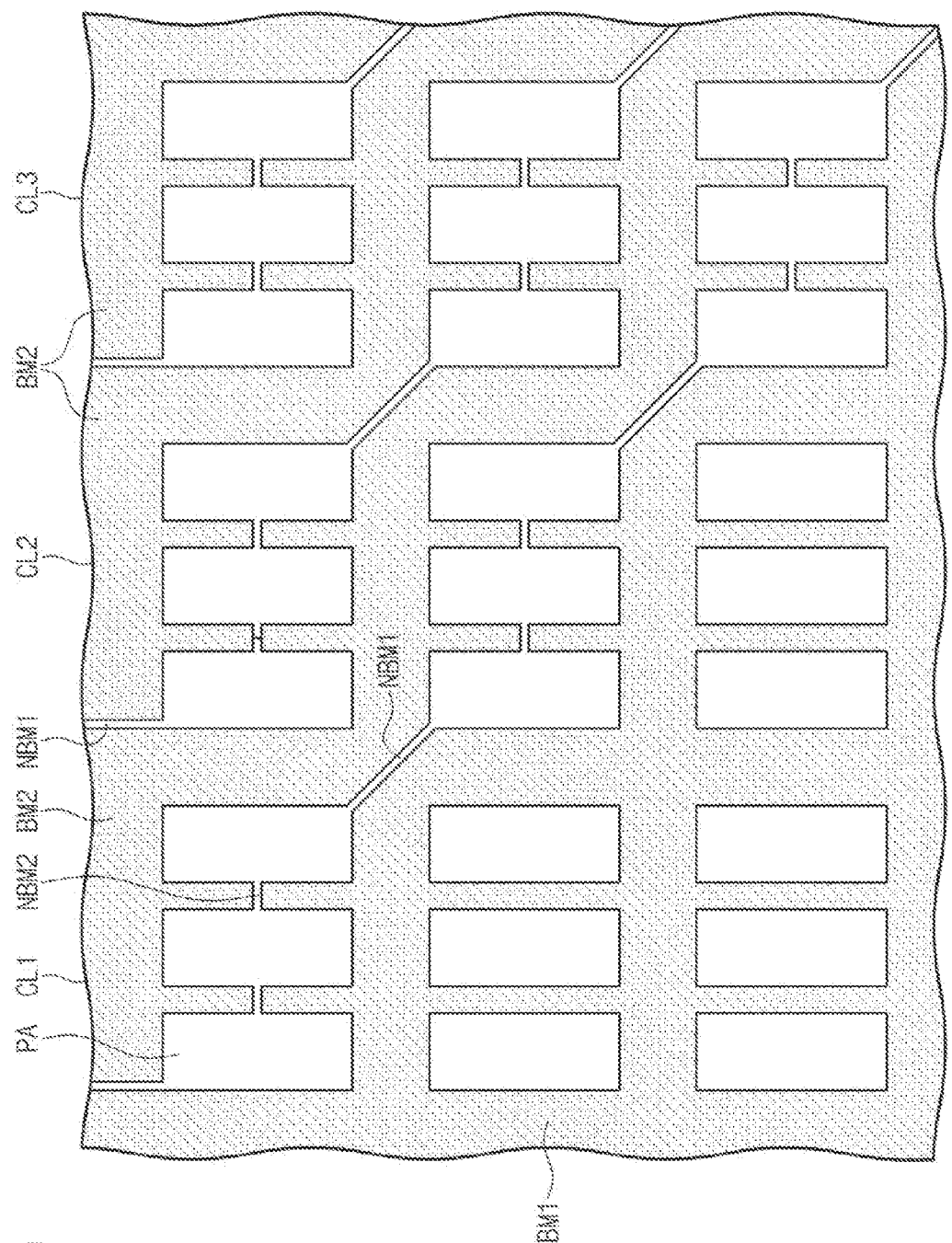
FIG. 9 is an enlarged view showing the black matrix of a portion B1 shown in FIG. 3.

FIG. 8 is an enlarged diagram showing the black matrix of the portion A1 shown in FIG. 3, and FIG. 9 is an enlarged diagram showing the black matrix of a portion B1 shown in FIG. 3.

Referring to FIGS. 8 and 9, the black matrix BM, which is disposed to be overlapped with the connection lines CL1 to CL4, has a predetermined pattern.

In more detail, the black matrices BM include a first black matrix BM1, which does not overlap the connection lines CL1 to CL4, and a plurality of second black matrices BM2, which overlap the connection lines CL1 to CL4.

The first black matrix BM1 is disposed in the non-pixel area NPA of the display panel 100 where the connection lines CL1 to CL4 are not disposed. The first black matrix BM1 is separated from the second black matrices BM2.

The second black matrices BM2 substantially extend in the fourth direction DR4, have a stepped shape, and are arranged in the third direction DR3. The second black matrices BM2 are bent every one pixel PX in the second direction DR2 and bent every three sub-pixels (including the first, second, and third sub-pixels SP1, SP2, and SP3) in the first direction DR1. The second black matrices BM2 may be disposed in the non-pixel area NPA and may be separated from each other in the non-pixel area NPA.

In an area of the display panel 100 where the second black matrices BM2 are disposed (hereinafter, referred to as an overlapping area), an area between the second black matrices BM2 adjacent to each other includes first non-black matrix areas NBM1 and second non-black matrix areas NBM2. The first and second non-black matrix areas NBM1 and NBM2 are areas where the black matrix BM is not disposed.

The first non-black matrix areas NBM1 connect a vertex of the pixel area PA of the first sub-pixel SP1 and a vertex of the pixel area PA of the third sub-pixel SP3, which face each other in the fourth direction DR4 and are adjacent to each other in the fourth direction DR4 in the overlapping area.

In the overlapping area, the first non-black matrix areas NBM1 extend to an upper portion from an area at an upper side of the pixel area PA of each of the first sub-pixels SP1 disposed at an uppermost position. According to exemplary embodiments, in the overlapping area, the first non-black matrix areas NBM1 extend to a right portion from a predetermined area at a right side of the pixel area PA of each of the third sub-pixels SP3 disposed at a rightmost position.

In the overlapping area, the second non-black matrix areas NBM2 connect center portions of sides of pixel areas PA, which face each other in the first direction DR1, and extend in the first direction DR1.

The connection lines CL1 to CL4, as described earlier with reference to FIGS. 5 to 7, are formed to overlap the second black matrices BM2. The connection lines CL1 to CL4 have the same shape as the second black matrices BM2. That is, each of the connection lines CL1 to CL4 has the same shape as a corresponding second black matrix BM2 of the second black matrices BM2 and is disposed to overlap the corresponding second black matrix BM2.

In exemplary embodiments, the connection lines CL1 to CLk have a width that is greater than that of the gate lines GL1_1 to GL1_$m$ and GL2_1 to GL2_$k$. In general, a resistance is inversely proportional to a width of a wire. Thus, a transmission characteristic of the gate signal transmitted through the connection lines CL1 to CLk may be improved.

As a result, the display apparatus 400 according to the present disclosure has a narrow bezel and an improved transmission characteristic of the gate signal.

FIGS. 10 to 14 are cross-sectional views showing a manufacturing method of the display apparatus according to an exemplary embodiment. For the convenience of explanation, the manufacturing method will be described using the cross-sectional views shown in FIGS. 5 to 7.

Figure 10:
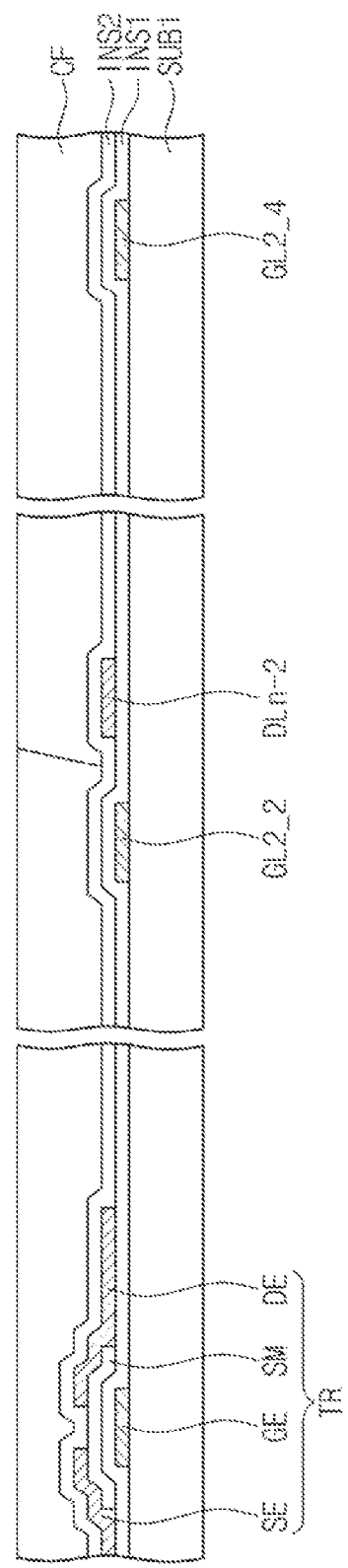
FIGS. 10, 11, 12, 13, and 14 are cross-sectional views showing a manufacturing method of the display apparatus according to an exemplary embodiment of the present disclosure.

Referring to FIG. 10, the transistor TR and the second gate lines GL2_2 and GL2_4 and the data line DLn−2, which are connected to the transistor TR, are formed on the first base substrate SUB1. The color filters CF are formed on the transistor TR, the gate lines GL2_2 and GL2_4, and the data line DLn−2.

Figure 11:
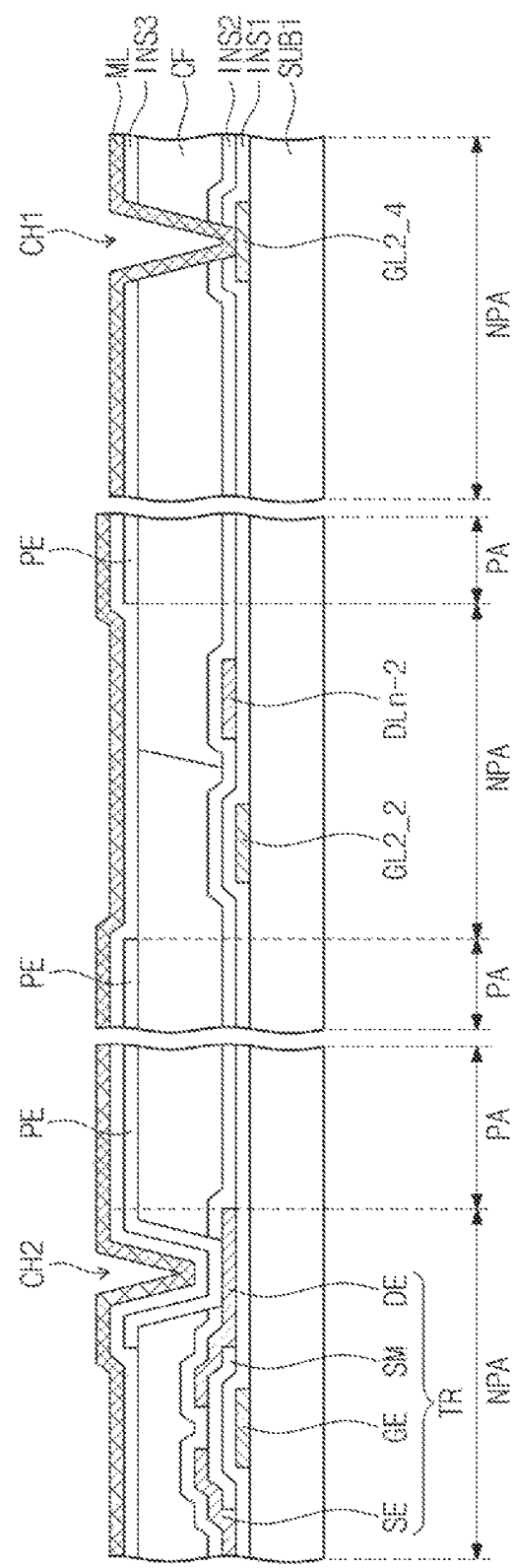

Referring to FIG. 11, the second contact hole CH2, through which a portion of the drain electrode DE is exposed, is formed penetrating the color filter CF. The pixel electrode PE is formed on the color filter CF in the pixel area PA. The connection electrode CNE extending from the pixel electrode PE is connected to the drain electrode DE through the second contact hole CH2.

The third insulating layer INS3 is formed on the color filters CF and the pixel electrode PE. The first contact hole CH1, through which a predetermined area at one end of the second gate line GL2_4 is exposed, is formed penetrating through the third insulating layer INS3, the color filter CF, and the first and second insulating layers INS1 and INS2.

A metal layer ML is formed on the third insulating layer INS3. The metal layer ML is electrically connected to the one end of the second gate line GL2_4 through the first contact hole CH1.

Figure 12:
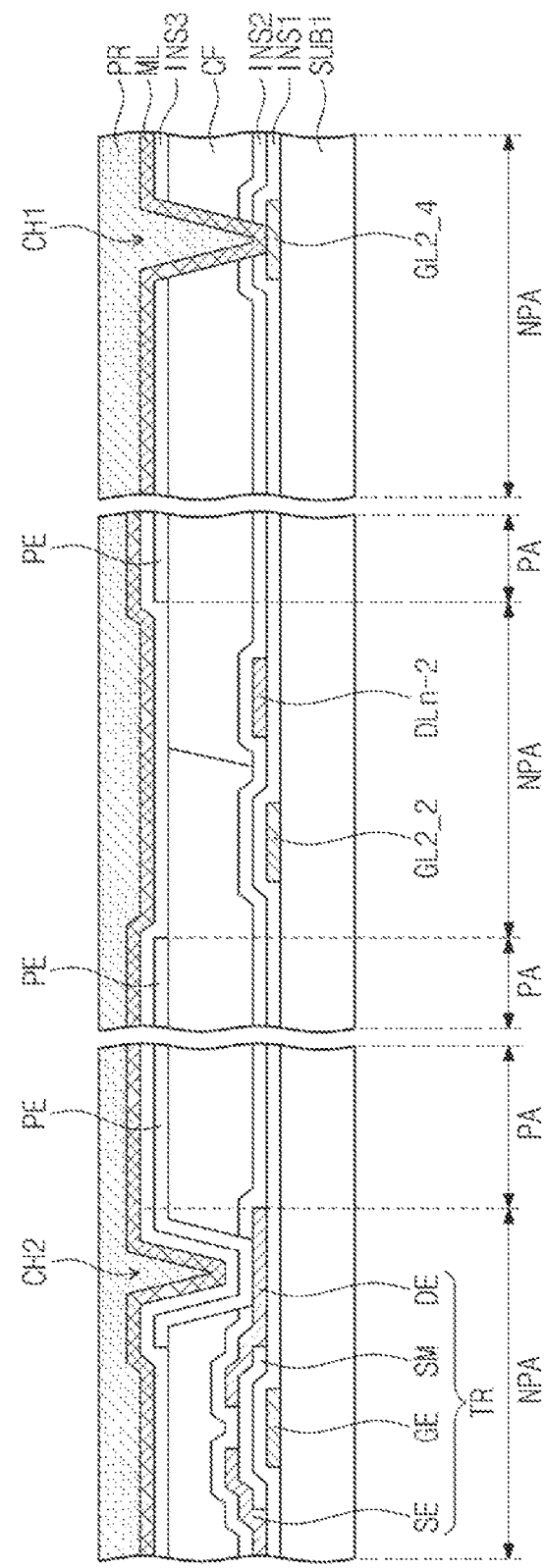

Referring to FIG. 12, a photosensitive resin PR (or a photoresist) having a black color is formed on the metal layer ML. The photosensitive resin PR may be, but not limited to, a positive type photoresist.

Figure 13:
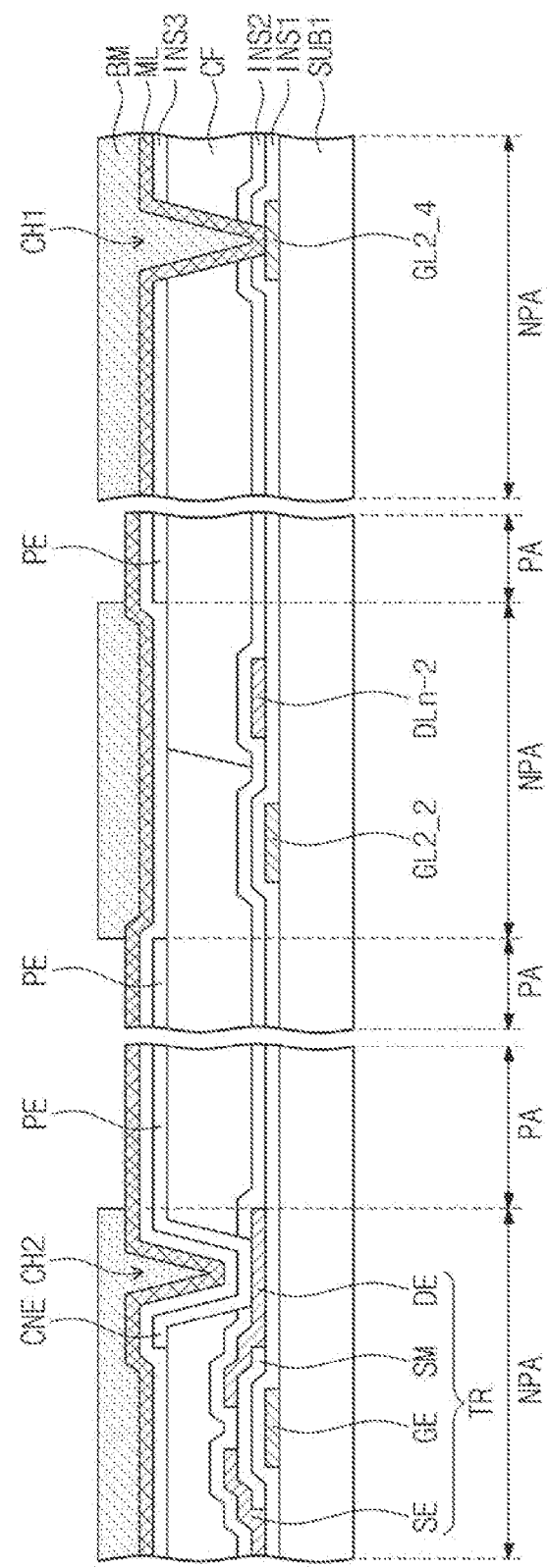

Referring to FIG. 13, the photosensitive resin PR in the pixel area PA may be exposed to a light, and then is developed and removed. Although not shown in figures, the photosensitive resin PR in the first and second non-black matrix areas NBM1 and NBM2 is exposed to the light, and then is developed and removed.

Although not shown in figures, a photo mask having the same shape as that of the black matrix BM may be used to expose the photosensitive resin PR to the light. The photo mask may transmit the light in the pixel area PA and the first and second non-black matrix areas NBM1 and NBM2 to provide the light to the photosensitive resin PR and may block the light in the area where the black matrix BM is formed.

The black matrix BM may be formed by a remaining photosensitive resin PR. The black matrix BM shown in FIG. 13 is the second black matrices BM2. Although not shown in the cross-sectional view, the first black matrix BM1 may be formed by the remaining photosensitive resin PR.

Figure 14:
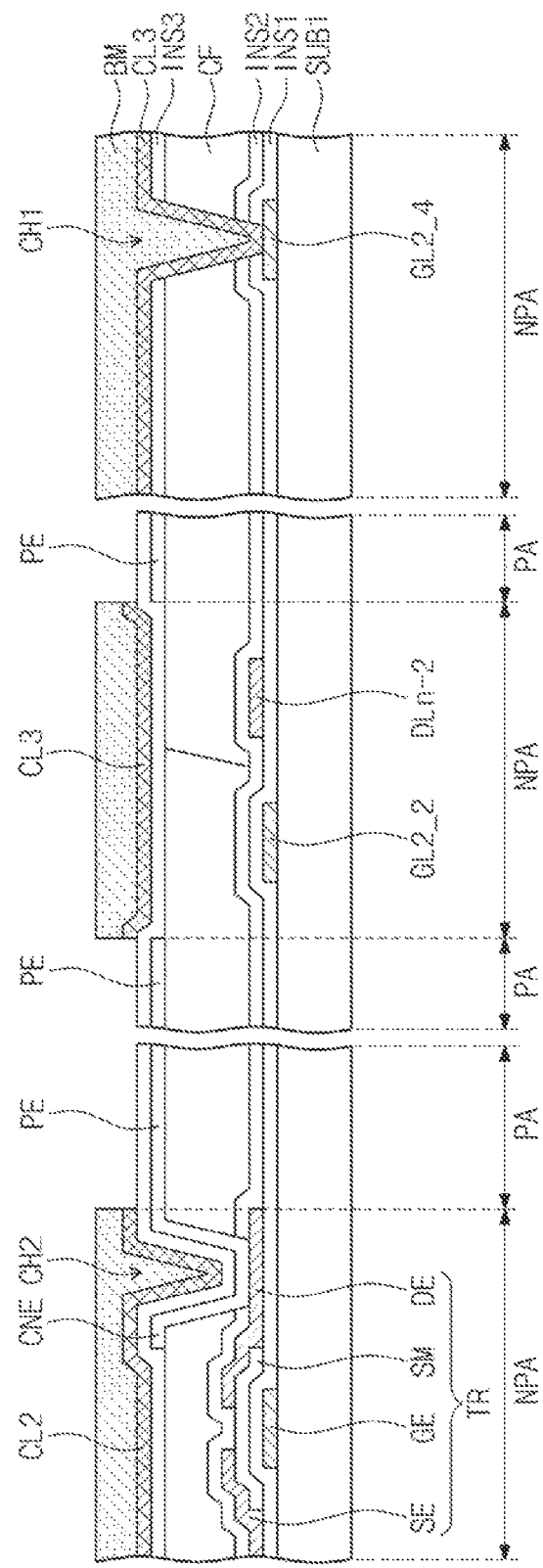

Referring to FIG. 14, portions of the metal layer ML, which do not overlap with the second black matrices BM2, are etched and removed by using the remaining second black matrices BM2 as a mask. The metal layer ML is etched to form the connection lines CL2 and CL3, which overlap with the second black matrices BM2.

The connection lines CL1 to CLk may have the same width as the gate lines GL1_1 to GL1_$m$ and GL2_1 and GL2_$k$ and may be formed on the gate lines GL1_1 to GL1_$m$ and GL2_1 and GL2_$k$ or under the data lines DL1 to DLn. In this case, an additional mask is used to pattern the connection lines CL1 to CLk. In general, since the cost of the mask may be high, the manufacturing cost increases when adding the mask. When the mask is added, the number of manufacturing processes increases since additional processes may be used.

However, according to the present exemplary embodiment, since the connection lines CL1 to CLk are formed by using the mask used to pattern the black matrix BM, an additional mask is not used to form the connection lines CL1 to CLk. Thus, the manufacturing cost is reduced and the manufacturing process is simplified.

Consequently, the display apparatus 400 according to the present exemplary embodiment may reduce the manufacturing cost and simplify the manufacturing process.

According to the above, the narrow bezel of the display apparatus may be realized and the transmission characteristic of the gate signals may be improved. The manufacturing cost may be reduced and the manufacturing process may be simplified.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:
1. A display apparatus, comprising:
   a display panel, comprising:
      first gate lines and second gate lines extending in a third direction between a first direction and a second direction crossing the first direction;
      data lines extending in the second direction;
      connection lines extending in a fourth direction crossing the third direction and electrically connected to the second gate lines; and pixels comprising pixel areas, electrically connected to the first gate lines, the connection lines, and the data lines, and disposed on the display panel; and a black matrix disposed in a non-pixel area surrounding each of the pixel areas, the black matrix comprising:
a first black matrix disposed so as not to overlap the connection lines; and
second black matrices overlapping the connection lines.

2. The display apparatus of claim 1, further comprising a gate driver and a data driver electrically connected to one side of the display panel in the second direction, wherein first ends of the first gate lines and first ends of the connection lines are electrically connected to the gate driver and a first ends of the data lines are electrically connected to the data driver.

3. The display apparatus of claim 2, wherein first ends of the second gate lines are disposed at one side of the display panel in the first direction, and second ends of the connection lines are electrically connected to corresponding second gate lines.

4. The display apparatus of claim 1, wherein each of the first and second gate lines extend in the third direction having a stepped shape, and each of the connection lines extend in the fourth direction having a stepped shape.

5. The display apparatus of claim 1, wherein each of the pixels comprises a first sub-pixel, second sub-pixel, and a third sub-pixel, and each of the first, second, and third sub-pixels is electrically connected to a corresponding gate line of the first and second gate lines and a corresponding data line of the data lines.

6. The display apparatus of claim 5, wherein the first and second gate lines and the connection lines are bent every pixel in the second direction and are bent every three sub-pixels in the first direction.

7. The display apparatus of claim 5, wherein each of the first, second, and third sub-pixels comprises:
a pixel electrode disposed in a corresponding pixel area; and
a transistor comprising:
a gate electrode electrically connected to a corresponding gate line of the first and second gate lines;
a source electrode electrically connected to a corresponding data line of the data lines;
and a drain electrode electrically connected to the corresponding pixel electrode.

8. The display apparatus of claim 7, wherein the display panel further comprises:
a first substrate on which the transistor is disposed;
color filters extending in the second direction and overlapping the pixels, arranged in the second direction, and disposed on the first substrate covering the transistor; and
an insulating layer disposed on the color filters covering the pixel electrodes, the pixel electrodes being disposed on the color filters,
wherein the connection lines are disposed on the insulating layer to overlap the second black matrices in the non-pixel area, and the second black matrices are disposed on the connection lines.

9. The display apparatus of claim 8, further comprising:
first contact holes penetrating the color filters and exposing a portion of the second gate lines; and
second contact holes penetrating the color filters and exposing a portion of the drain electrodes, wherein the connection lines are electrically connected to the second gate lines through the first contact holes, and the pixel electrodes extend and are electrically connected to the drain electrodes through the second contact holes.

10. The display apparatus of claim 5, wherein each of the connection lines has a same shape as a corresponding second black matrix and overlaps the corresponding second black matrix.

11. The display apparatus of claim 10, wherein the second black matrices extend in the fourth direction having a stepped shape and are disposed to be separated from each other.

12. The display apparatus of claim 10, wherein the pixel area of each sub-pixel has a rectangular shape, and an area between two second black matrices adjacent to each other comprises:
first non-black matrix areas that each connects a vertex of the pixel area of the first sub-pixel and a vertex of the pixel area of the third sub-pixel facing each other in the fourth direction in an overlapping area, in which the second black matrices are disposed, extends in an upper direction from an area of an upper side of the pixel area of each first sub-pixel disposed at an uppermost portion in the overlapping area, and extends in a right direction from an area corresponding to a right side of the pixel area of each third sub-pixel disposed at a rightmost portion in the overlapping area; and
second non-black matrix areas that each connect center portions of sides of the pixel areas of the overlapping area in the first direction and extend in the first direction.

13. A method of manufacturing a display apparatus, comprising:
disposing first gate lines and second gate lines extending in a third direction between a first direction and a second direction crossing the first direction;
disposing data lines insulated from the first and second gate lines and extending in the second direction;
disposing connection lines insulated from the data lines, extending in a fourth direction crossing the third direction, and electrically connected to the second gate lines;
disposing a plurality of pixels comprising pixel areas, the pixels being electrically connected to the first gate lines, the connection lines, and the data lines; and
disposing a black matrix on the pixels in a non-pixel area surrounding each of the pixel areas, wherein the black matrix comprises:
a first black matrix disposed to not overlap the connection lines; and
second black matrices that overlap the connection lines.

14. The method of claim 13, wherein first ends of the first gate lines, first ends of the data lines, and first ends of the connection lines are disposed at an upper side of a display panel, in which the pixels are disposed, in the second direction, first ends of the second gate lines are disposed at one side of the display panel in the first direction, and second ends ends of each of the connection lines are connected to first ends of corresponding second gate lines.

15. The method of claim 13, wherein the first and second gate lines extend in the third direction having a stepped shape, and the connection lines extend in the fourth direction having the stepped shape.

16. The method of claim 13, wherein each of the pixels comprises a first sub-pixel, a second sub-pixel, and a third sub-pixel, each of which is electrically connected to a corresponding gate line of the first and second gate lines and a corresponding data line, and the first and second gate lines and the connection lines are bent every pixel in the second direction and bent every three sub-pixels in the first direction.

17. The method of claim 13, wherein the forming of the first, second, and third sub-pixels comprises:
   disposing a transistor comprising a gate electrode electrically connected to a corresponding gate line of the first and second gate lines, a source electrode electrically connected to a corresponding data line of the data lines, and a drain electrode on a first substrate;
   disposing a color filter on the first substrate covering the transistor;
   disposing a pixel electrode electrically connected to the drain electrode on the transistor in the pixel area;
   disposing an insulating layer on the color filter covering the pixel electrode;
   disposing a metal layer on the insulating layer;
   disposing a photosensitive resin comprising a black color on the insulating layer;
   exposing and developing the photosensitive resin to form the first and second black matrices; and
   etching the metal layer using the first and second black matrices as a mask to form the connection lines.

18. The method of claim 17, further comprising:
   disposing first contact holes penetrating the color filters to expose a portion of the second gate lines; and
   disposing second contact holes penetrating the color filters to expose a portion of the drain electrodes,
   wherein the connection lines are electrically connected to the second gate lines through the first contact holes and the pixel electrodes extend to be electrically connected to the drain electrodes through the second contact holes.

19. The method of claim 16, wherein each of the connection lines has a same shape as a corresponding second black matrix, overlapping the corresponding second black matrix, and the second black matrices extend in the fourth direction having a stepped shape and are separated from each other.

20. The method of claim 19, wherein the pixel area of each sub-pixel has a rectangular shape, and an area between two second black matrices adjacent to each other comprises:
   first non-black matrix areas that each connects a vertex of the pixel area of the first sub-pixel and a vertex of the pixel area of the third sub-pixel facing each other in the fourth direction in an overlapping area, in which the second black matrices are disposed, extends in an upper direction from an area of an upper side of the pixel area of each first sub-pixel disposed at an uppermost portion in the overlapping area, and extends in a right direction from an area of a right side of the pixel area of each third sub-pixel disposed at a rightmost portion; and
   second non-black matrix areas that each connects center portions of sides of the pixel areas of the overlapping area in the first direction and extends in the first direction.

* * * * *